(12) United States Patent
Knoot

(10) Patent No.: US 6,395,643 B1
(45) Date of Patent: May 28, 2002

(54) GAS MANIFOLD FOR UNIFORM GAS DISTRIBUTION AND PHOTOCHEMISTRY

(75) Inventor: Peter A. Knoot, San Carlos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/712,312

(22) Filed: Nov. 13, 2000

Related U.S. Application Data

(62) Division of application No. 09/087,489, filed on May 29, 1998, now Pat. No. 6,187,133.

(51) Int. Cl.[7] ............................................. H01L 21/302
(52) U.S. Cl. ........................ 438/730; 438/695; 438/771
(58) Field of Search ............................ 427/38; 438/698, 438/730, 770, 771, 935

(56) References Cited

U.S. PATENT DOCUMENTS

| | | | |
|---|---|---|---|
| 4,522,674 A | 6/1985 | Ninomiya et al. | 156/345 |
| 4,529,475 A * | 7/1985 | Okano et al. | 156/643 |
| 4,540,466 A | 9/1985 | Nishizawa | 156/643 |
| 4,558,660 A | 12/1985 | Nishizawa et al. | 118/725 |
| 4,719,122 A | 1/1988 | Yamazaki | 427/53.1 |
| 4,801,352 A | 1/1989 | Piwczyk | 156/643 |
| 4,811,684 A | 3/1989 | Tashiro et al. | 118/50.1 |
| 4,822,450 A | 4/1989 | Davis et al. | 156/643 |
| 4,836,140 A | 6/1989 | Koji | 118/722 |
| 4,886,570 A | 12/1989 | Davis et al. | 156/643 |
| 4,988,533 A * | 1/1991 | Freeman et al. | 427/38 |
| 4,989,544 A | 2/1991 | Yoshikawa | 118/723 |
| 5,119,760 A | 6/1992 | McMillan et al. | 118/722 |
| 5,155,336 A | 10/1992 | Gronet et al. | 219/411 |
| 5,156,820 A | 10/1992 | Wong et al. | 422/186.05 |
| 5,433,787 A | 7/1995 | Suzuki et al. | 118/723 |
| 5,565,036 A * | 10/1996 | Westendorp et al. | 118/723 MP |
| 5,715,361 A | 2/1998 | Moslehi | 392/416 |

FOREIGN PATENT DOCUMENTS

| | | | |
|---|---|---|---|
| EP | 0 821 085 A1 | | 1/1998 |
| JP | 5764933 A | * | 4/1982 |
| JP | 261830 A | * | 10/1989 |
| JP | 388328 A | * | 4/1991 |
| JP | 06 302525 A | | 10/1994 |

* cited by examiner

Primary Examiner—John F. Niebling
Assistant Examiner—Christopher Lattin
(74) Attorney, Agent, or Firm—Pennie & Edmonds LLP

(57) ABSTRACT

The invention provides a system for providing a flow of a short-lived, reactive process gas species into an RTP chamber without creating ionic species. An RTP chamber includes a transparent quartz window assembly. The window assembly has a first pane facing a wafer inside the RTP chamber. A second pane is positioned adjacent a heat lamp array on the outside of the RTP chamber. A window side wall joins the first and second panes at their peripheral edges to provide an internal chamber therebetween. A plurality of channels extend through the first pane from the internal chamber to the inside of the RTP chamber. A port communicates between the internal chamber and a process gas source. The window assembly also includes a reflective surface facing the internal chamber. An ultraviolet light source is positioned to illuminate process gas flowing through the window assembly with ultraviolet light such that the ultraviolet light alters the chemistry of the process gas. A process using the reactive gas species can be turned on and off quickly by turning on and off the ultraviolet light.

13 Claims, 4 Drawing Sheets

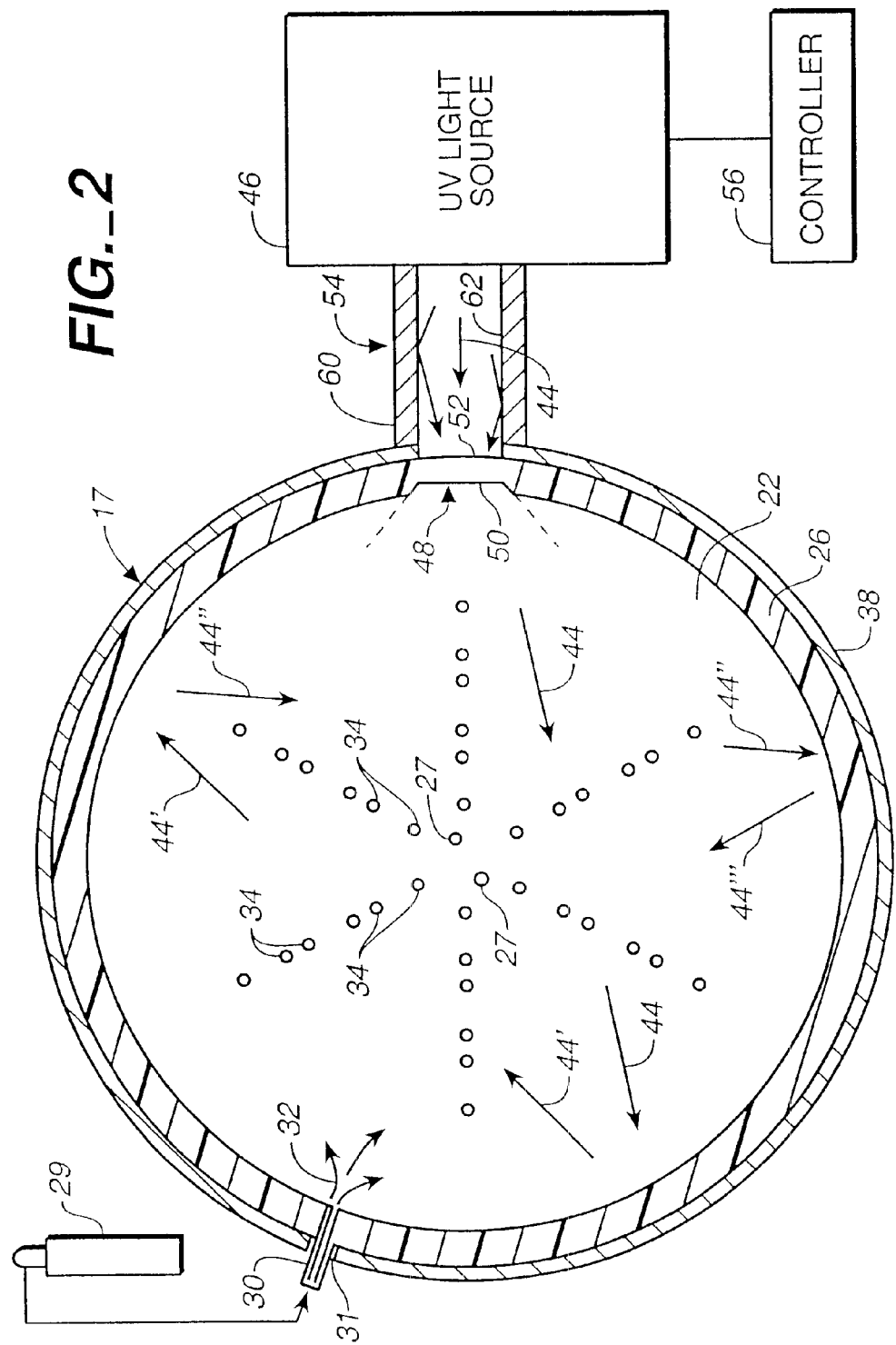
FIG._2

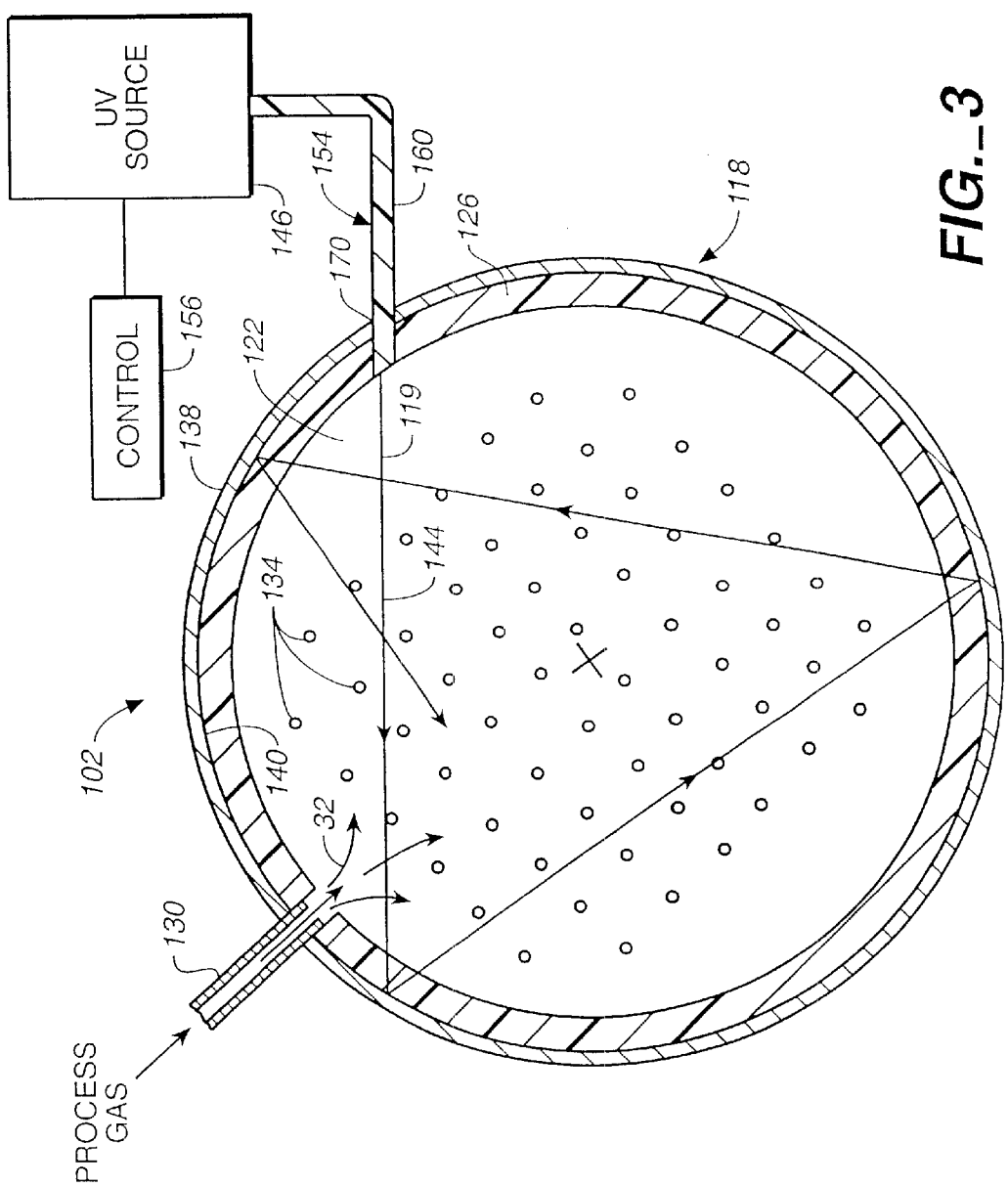
FIG._3

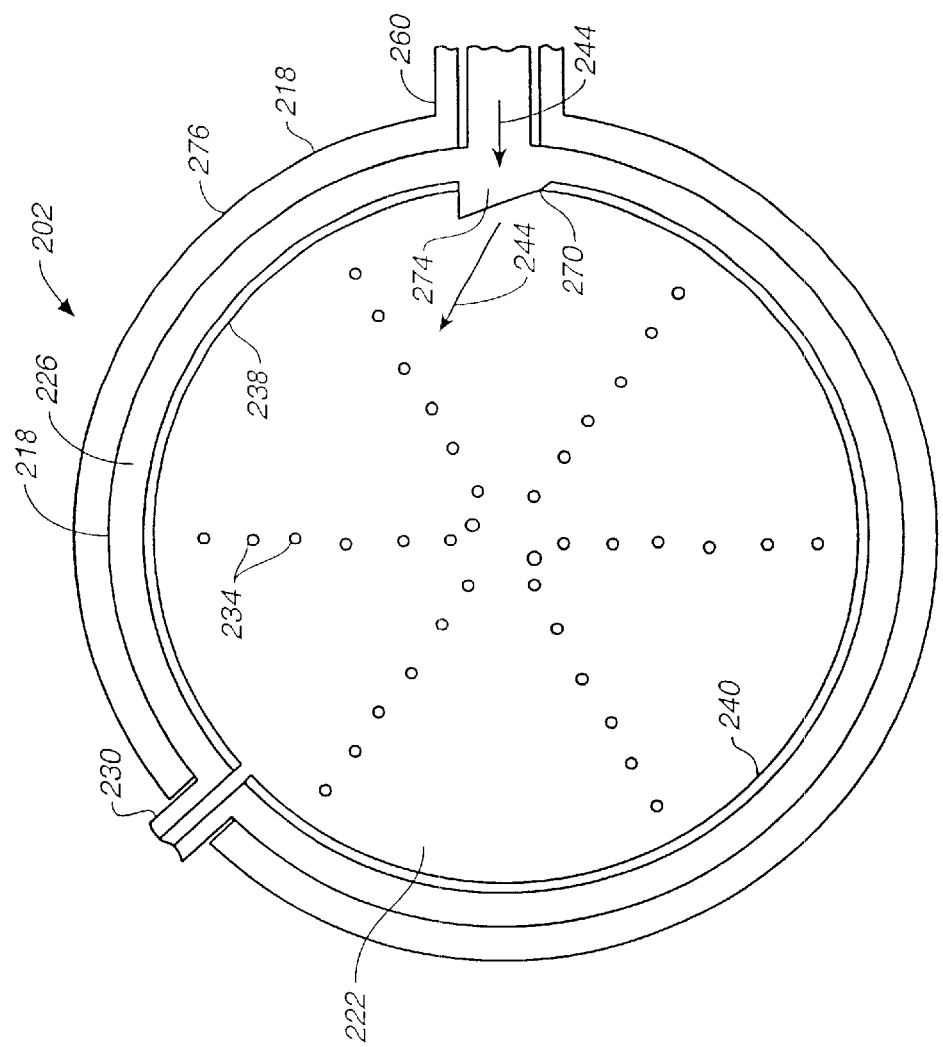
FIG._4

GAS MANIFOLD FOR UNIFORM GAS DISTRIBUTION AND PHOTOCHEMISTRY

CROSS-REFERENCE TO RELATED APPLICATION

This is a divisional of application Ser. No. 09/087,489, files May 29, 1998 now U.S. Pat. No. 6,187,133.

BACKGROUND OF THE INVENTION

The invention relates to a method and apparatus for producing short-lived reactive species in a rapid thermal processing (RTP) system.

RTP systems are employed in semiconductor chip fabrication to create, chemically alter, or etch surface structures on semiconductor wafers. In one type of system, an RTP chamber includes a gas manifold, sometimes referred to as a gas showerhead, positioned above the surface of the wafer to provide a flow of a process gas to the wafer surface. Radiant energy from a heat lamp array passes through the manifold, which can be made of transparent quartz, to heat the wafer during processing. Spent process gas can be pumped out through a vacuum port of the chamber.

Completely replacing one process gas with another one typically takes several minutes with a conventional gas showerhead system. For this reason, it is very difficult to rapidly switch from one type of process to another at the surface of the wafer, such as is desirable in creating very thin layers or structures on the wafer surface. Some RTP processes employ highly reactive species, such as atomic species. In conventional systems, these species are created outside the RTP system, for example, with an electric discharge. The reactive species created by such methods must travel long paths to reach the wafer with conventional showerhead systems. Atomic species can also be created with an electric discharge within the RTP chamber, but employing an electric discharge close to the wafer surface also creates a plasma that can be detrimental to the semiconductor devices being formed on the wafer.

SUMMARY OF THE INVENTION

According to one aspect of the invention, an apparatus for producing a reactive gas in a processing chamber includes a gas manifold that has walls providing an internal chamber. A first wall includes a side facing a work piece, another side facing the internal chamber, and a plurality of channels extending from the internal chamber to the side facing the work piece. The gas manifold also includes a port for coupling a gas source to the internal chamber such that a gas flowing into the internal chamber through the port flows out through the channels toward a surface of the work piece. An ultraviolet light source is structured and arranged to illuminate the gas flowing through the gas manifold for altering the chemistry of the gas. The gas manifold can include a reflective surface facing the internal chamber for reflecting the ultraviolet light.

The walls of the gas manifold can comprise a window formed of transparent quartz. A second wall can be arranged spaced apart from the first wall and adjacent a heat lamp array, with a side wall joining the first and second walls at their peripheral edges. The ultraviolet light source is structured and arranged to illuminate the gas in the internal chamber through a window region in the side wall, the ultraviolet light being directed between the first and second walls.

According to another aspect of the invention, a rapid thermal processing chamber for processing a semiconductor wafer positioned within the processing chamber includes a transparent window. The window includes a first pane facing the wafer inside the processing chamber, a second pane being adjacent a heat lamp array on the outside of the processing chamber, a window side wall joining the first and second panes at their peripheral edges to provide an internal chamber therebetween, a plurality of channels extending through the first pane from the internal chamber to the inside of the processing chamber, a port communicating between the internal chamber and a process gas source, and a reflective surface facing the internal chamber. An ultraviolet light source is positioned to illuminate process gas flowing through the window with ultraviolet light such that the ultraviolet light alters the chemistry of the process gas. The ultraviolet light source directs the ultraviolet light substantially parallel to the first and second panes, and into the internal chamber such that the ultraviolet light reflects from the reflective surface in a plurality of different directions within the internal chamber.

In both the gas manifold and the processing chamber, the ultraviolet light source can include one of an ultraviolet lamp, a mercury discharge lamp, and a ultraviolet laser. The ultraviolet light source can also include a controller for turning the illumination on and off, and optical elements directing the ultraviolet light from the ultraviolet light source to pass through a transparent window region of the window side wall into the internal chamber. If the ultraviolet light source is a laser, the controller can include a tuner capable of changing the wavelength of the ultraviolet light provided by the laser.

According to yet another aspect of the invention, a method of processing a semiconductor wafer in a semiconductor process chamber includes the steps of providing a flow of a precursor gas species into a gas manifold, illuminating the precursor gas species in the gas manifold with ultraviolet light, wherein the ultraviolet light interacts with the precursor gas species to create a product gas species, and flowing the product gas species through a plurality of apertures in the manifold towards the wafer in the processing chamber. The illuminating can include reflecting the ultraviolet light off a reflective surface of the manifold so that the ultraviolet light passes through the gas manifold more than once, thereby increasing the interaction with the precursor gas species. The processing can be controlled by controlling the illuminating.

The gas manifold can include a transparent window, and the method can further include the step of heating the wafer by shining radiant energy from a heat lamp array through the window.

The product gas species, which is non-ionic and will typically be more reactive than the precursor gas species, can include nitric oxide, ozone, an atomic species, or any other gas species that can be produced by illuminating a precursor gas species with ultraviolet light. The product gas species can be a reactive gas species having a half-life of about a minute or less.

According to still another aspect of the invention, a method of controlling a process in a semiconductor processing chamber includes the steps of flowing a first gas into an internal chamber of a gas manifold and thence through apertures of the manifold toward a semiconductor wafer in the processing chamber, controlling an ultraviolet light source to illuminate the first gas within the gas manifold with ultraviolet light, wherein the ultraviolet light interacts with the first gas to produce a second gas which comprises a non-ionic species, and flowing the second gas through the apertures toward the semiconductor wafer. The method may further include stopping the flowing of the second gas by controlling the ultraviolet light source to stop illuminating the first gas within the gas manifold. The method may also include heating the wafer by shining radiant energy on the wafer through the gas manifold.

An advantage of the invention is that it provides a wafer processing method and apparatus for producing highly reactive chemical species, including atomic species, from less dangerous, less reactive, and longer-lived precursors. A further advantage of the invention is that the process does not produce ionic species, and therefore reduces the risk of damaging the semiconductor devices being formed on the wafer with such species.

Many of the reactive species formed according to the invention are short-lived, and therefore do not pose a disposal or storage problem. The short-lived species can be produced and delivered to the surface of a wafer in large enough quantities to enable faster processing. By multiply reflecting the UV light within the gas manifold, the precursor gas species is exposed to a higher intensity of UV radiation than would otherwise be available from the same source. This produces greater quantities of reactive product gas species in less time than with systems that do not employ multiple reflections. When processing with short-lived species according to the invention, turning the ultraviolet light on and off starts and stops the flow of the reactive species to the wafer in much shorter time periods than could be achieved with prior art systems, which feature allows for precise process control and rapid switching between processes.

BRIEF DESCRIPTION OF THE DRAWINGS

FIG. 2 is a view in partial section through line 2—2 of FIG. 1.

FIG. 3 is a partial section view similar to FIG. 2 illustrating another embodiment of a gas manifold assembly according to the invention.

FIG. 4 is a partial section view similar to FIGS. 2 and 3 that illustrates a third embodiment of a gas manifold assembly.

DETAILED DESCRIPTION OF THE INVENTION

Figure 1:
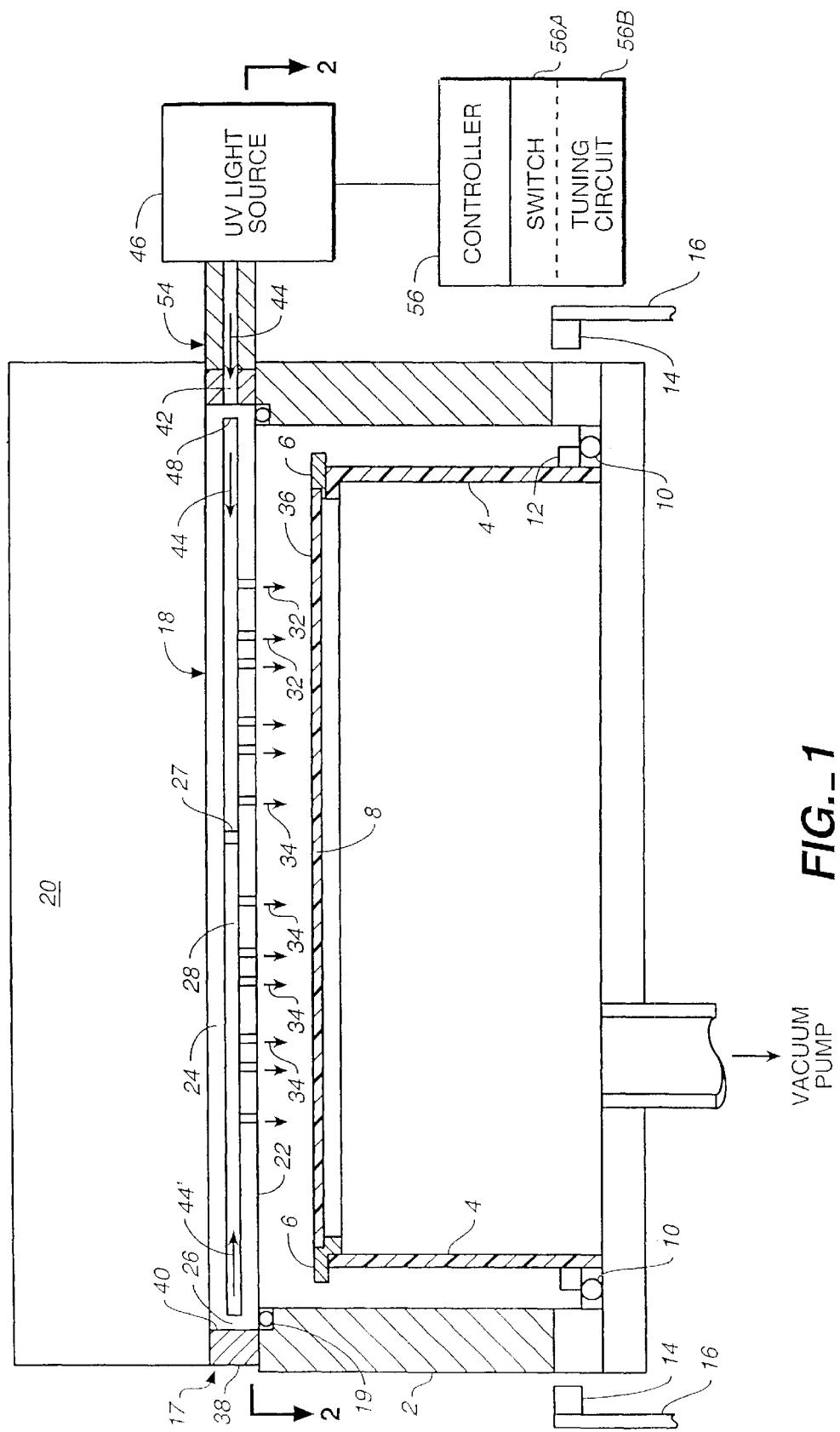
FIG. 1 is a schematic view in partial section of a portion of a rapid thermal processing chamber according to the invention.

Referring to FIG. 1, an rapid thermal process chamber 2 includes a quartz cylinder 4 supporting an edge ring 6, which in turn supports a semiconductor wafer 8 along its peripheral edge. It will be understood that the drawings are not to scale, but instead are drawn to best illustrate the features of the invention. Cylinder 4 is rotatably supported from the walls of process chamber 2 by a bearing assembly 10. Magnets 12, which are mounted on cylinder 4, have magnetic fields that extend through the walls of process chamber 2 and that couple to magnets 14 mounted on a rotatably driven drive ring 16. Rotating drive ring 16 causes cylinder 4 and wafer 8 to rotate. The magnetic coupling eliminates the need for a vacuum sealed drive assembly.

Referring now also to FIG. 2, a gas manifold assembly 17 is positioned directly above wafer 8. Gas manifold assembly 17 includes a transparent, substantially cylindrically-shaped, fused quartz window 18. On an opposite side of window 18, outside of process chamber 2, is a lamp array 20 that heats wafer 8 with radiant energy. In the embodiment illustrated in FIGS. 1 and 2, gas manifold assembly 17 is held by lamp array 20 with tabs (not shown). An o-ring 19 provides a seal between window 18 and a wall of process chamber 2. Other arrangements can be employed to hold gas manifold assembly 17 between lamp array 20 and wafer 8.

Window 18 includes a bottom pane 22 and a top pane 24 that are joined at their peripheral edges by a window side wall 26. Panes 22, 24 are separated by a small gap to provide an internal chamber 28 therebetween. Two posts 27 located near the center of window 18 provide additional structural support between panes 22, 24.

A process gas source 29 is coupled to a gas inlet 30 (not shown in FIG. 1) in window side wall 26. A process gas 32 flows into internal chamber 28 through inlet 30. Although FIG. 2 illustrates an embodiment with a single gas inlet 30, window 18 can include more than one gas inlet 30. Thirty-six (36) small channels 34 each extend through bottom pane 22. Process gas 32 flows out from internal chamber 28, through channels 34, at right angles toward wafer surface 36. Process gas 32 becomes evenly distributed across wafer surface 36 when wafer is rotated by the magnetic coupling to drive ring 16.

Gas manifold assembly 17 also includes a metal ring 38 substantially surrounding window side wall 26. Metal ring 38 has a high-finish reflective surface 40 facing the outside of window side wall 26 and facing internal chamber 28. A slot 31 is provided in metal ring 38 for gas inlet 30. Metal ring 38 also includes an opening 42 through which ultraviolet (UV) light 44 produced by a UV light source 46 is directed through a window region 48 of window side wall 26 into internal chamber 28. Window region 48 includes flat faces 50, 52 and is thinner than the rest of window side wall 26.

UV light source 46 can be employed with optical elements 54 to direct UV light 44 to shine onto window region 48. In the described embodiment, optical elements 54 include a rectangular-shaped stainless steel tube 60 connecting between UV light source 46 and metal ring 38. Tube 60 has a high-finish inner reflecting surface 62 that directs UV light 44 through window region 48 into internal chamber 28 substantially in a plane that is parallel to panes 22, 24 and also parallel to wafer 8. UV light 44 enters internal chamber 28 at a variety of angles within that plane. As shown in FIG. 2, UV light 44 entering internal chamber 28 undergoes multiple reflections (e.g., 44', 44", 44''') from reflective surface 40, changing direction and path with each reflection. UV light 44 can pass through window 18 more than one time or even several times due to the reflections from reflective surface 40.

UV light 44 can transform process gas 32, which may be a precursor gas species, into a different and more reactive product species. The multiple reflections tend to increase the interactions with molecules of process gas 32 within internal chamber 28, thereby increasing the production of the product species. The precursors may be less toxic, less unstable, or less corrosive than the product species, and therefore easier to store and handle. For example,

| $N_2O + h\upsilon \longrightarrow NO + O$ | (nitric oxide) |
| $2O_2 + h\upsilon \longrightarrow O_3 + O$ | (ozone) |
| $CF_2Cl_2 + h\upsilon \longrightarrow Cl + CF_2Cl$ | (atomic chlorine) |

-continued

| | |
|---|---|
| $N_2 + h\nu \rightarrow N + N$ | (atomic nitrogen) |
| $CF_4 + h\nu \rightarrow F + CF_3$ | (atomic fluorine). |

In addition, the invention can be employed to make other atomic species, such as atomic oxygen and atomic hydrogen, and to make other molecular species. The process makes the product species without making any ionic species. Although the product species are typically short-lived, many of them having a half-life of about a minute or less, significant quantities of the product species flow through channels 34 onto wafer surface 36.

When the product species is a highly reactive species that dissipates quickly, reactions on wafer surface 36 can be turned on or off rapidly by turning UV light 44 on or off using a controller 56. Controller 56 may include an electronic switch 56A coupled directly to UV light source 46, or the electronic switch 56A may be coupled to a physical switch that forms part of optics 54, for example, a rotatable mirror (not shown) interposed in the path of UV light 44 entering window 18.

UV light source 46 can include any UV light source producing UV light of a wavelength and intensity useful for producing one or more selected species for a selected process. UV light source 46 may include a UV lamp, a mercury (Hg) vapor discharge lamp, or a UV laser. Some UV lasers can be tuned to produce different wavelengths of light, which can be used to create different product species from different precursor gases. In general, one would use a wavelength tuned to maximize the production of a desired reactive product species from a selected precursor gas. A tuning circuit 56B may be included in controller 56. The rate at which the reactive product species is produced and delivered to surface 36 of wafer 8 depends on several factors, including the intensity of UV light 44 within internal chamber 28, the dwell time of process gas 32 within internal chamber 28, the gas flow rate and the half-life of the reactive species. In general, process parameters would be set empirically.

In the embodiment illustrated in FIGS. 1 and 2, window 18 is formed of clear fused quartz, for example, NSG OZ or GE 214. Window side wall 26 has an outer diameter of about 13.68 inches (347 mm) and a thickness of about 0.5 inch (12.6 mm). Bottom pane 22 is about 0.08 inch (2 mm) thick, top pane 24 is about 0.08 inch (2 mm) thick, and gap 28 is about 0.08 inch (2 mm). Window area 48 has a width along window side wall 26 of about 1.6 inches (40 mm) and a thickness of about 0.25 inch (8.2 mm). Channels 34, which each have a diameter of about 0.062 inch (1.6 mm) are arrayed on three equally spaced diagonals of window 18 on six concentric bolt circles having diameters of 1.732 inches (44 mm), 3.465 inches (88 mm), 4.221 inches (107 mm), 6.063 inches (153 mm), 6.933 inches (176 mm), and 8.666 inches (220 mm). Support posts each have a diameter of about 0.08 inches (2 mm) and are positioned on a 0.84 inch (21 mm) bolt circle. Gas feed-through 30 has a 0.078 inch (2 mm) diameter central channel. Metal ring 38 is made of stainless steel with a high finish inner reflecting surface 40. Wafer 16 is positioned about 0.15–0.3 inches (4–8 mm) below window 18.

UV light source 46 and optical elements 54 will typically be located outside of process chamber 10, where they can be serviced easily and be protected from the harsh processing environment. Optical elements 54 can include any suitable means or combination of means to direct UV light 44 from UV light source 46 into internal chamber 28, for example, optic fiber elements, lenses, fixed and movable mirrors, windows and the like. Optical elements 54 may be eliminated altogether if a beam of UV light 44 can be made to shine directly into window area 48.

In another embodiment of a gas manifold assembly 102, illustrated in FIG. 3, a metallic coating 138 on a window side wall 126 provides a reflective surface 140. Metallic coating 138 may be deposited directly on window, for example, by evaporative deposition, sputter deposition, or any other metal coating technique. Optical elements 154 in this embodiment include a fiber optic element 160, which directs a beam of UV light 144 from a tunable laser UV light source 146 through an aperture 170 in metallic coating 138. The beam is directed along a non-diagonal chord 119 into window 118 to increase the reflections and interactions with precursor gas molecules within internal chamber 128.

Referring now to FIG. 4, another embodiment of a gas manifold assembly 202 includes a pattern of apertures 234 in a bottom pane 222 of window 218 that is similar to the pattern described above with reference to FIG. 2. A gas inlet 230 permits a flow of process gas into window 218. In this embodiment, a metal coating 238 provides a reflective surface 240 on an inside surface of a window side wall 226. An aperture 270 in reflective surface 240 permits UV light 244 to enter internal window 218 through a fiber optic coupling 260. This embodiment also includes a light deflecting optical device 274 that directs UV light 244 in off-diagonal directions to increase the reflections within internal chamber 228. Light deflecting optical device 274 can be a prism, a fresnel lens or the like. A metal ring 276 substantially surrounding window 218 can help to hold window 218 in position. Metal ring 276 may have a light absorbing interior coating to help stop stray UV light from leaking out from the areas of gas inlet 230 and fiber optic fitting 260.

Gas manifold assemblies can be made according to the invention with dimensions and materials other than those employed with the described embodiments. The number of channels in the bottom pane of the window and the arrangement of the channels can be changed to suit the size and shape of the work piece toward which the reactive process gas is directed.

Other embodiments are within the scope of the claims.

What is claimed is:

1. A method of processing a semiconductor wafer in a semiconductor process chamber, comprising:
   providing a flow of a precursor gas species into a gas manifold;
   illuminating the precursor gas species in the gas manifold with light, wherein the light travels in directions substantially parallel to the wafer and interacts with the precursor gas species to create a product gas species; and
   flowing the product gas species through a plurality of apertures of the gas manifold towards the wafer in the processing chamber.

2. The method of claim 1, wherein illuminating includes directing the light into the gas manifold, the light undergoing multiple reflections off a reflective surface of the gas manifold.

3. The method of claim 1, wherein the gas manifold comprises a transparent window, the method further comprising heating the wafer by shining radiant energy from a heat lamp array through the window.

4. The method of claim 1, wherein the product gas species comprises nitric oxide.

5. The method of claim 1, wherein the product gas species comprises ozone.

6. The method of claim 1, wherein the product gas species comprises an atomic species.

7. The method of claim 1, further including controlling the processing by controlling the illuminating.

8. The method of claim 1, wherein the product gas species comprises a gas species having a half-life of about a minute or less.

9. A method of controlling a process in a semiconductor processing chamber, comprising:

flowing a first gas into an internal chamber of a gas manifold and thence through apertures of the gas manifold toward a semiconductor wafer in the processing chamber;

controlling a light source to illuminate the first gas within the gas manifold with light, wherein the light travels in directions substantially parallel to the wafer and interacts with the first gas to create a second gas that includes a non-ionic species;

flowing the second gas through the apertures toward the semiconductor wafer.

10. The method of claim 9, further comprising stopping the flowing of the second gas by controlling the light source to stop illuminating the first gas within the gas manifold.

11. The method of claim 9, wherein illuminating the first gas includes directing the light into the gas manifold, the light undergoing multiple reflections from a reflective surface of the gas manifold.

12. The method of claim 9, wherein the non-ionic species comprises an atomic species.

13. The method of claim 9, further comprising heating the wafer by shining radiant energy on the wafer through the gas manifold.

\* \* \* \* \*